United States Patent [19]
Lee

[11] Patent Number: 5,795,801
[45] Date of Patent: Aug. 18, 1998

[54] METHODS OF FABRICATING PROFILED DEVICE WELLS FOR IMPROVED DEVICE ISOLATION

[75] Inventor: Kang-yoon Lee, Kyungki-do, Rep. of Korea

[73] Assignee: Samsung Electronics Co., Ltd., Rep. of Korea

[21] Appl. No.: 694,641

[22] Filed: Aug. 9, 1996

[30] Foreign Application Priority Data

Oct. 25, 1995 [KR] Rep. of Korea .................. 95-37168

[51] Int. Cl.$^6$ ............................................. H01L 21/8238
[52] U.S. Cl. .................. 438/199; 438/222; 438/433; 438/524; 438/525; 438/527; 148/DIG. 85; 148/DIG. 86
[58] Field of Search ........................... 438/199, 221, 438/424, 433, 514, 524, 525, 527, 222, 169, 172, 216, 217, 218; 148/DIG. 85, DIG. 86

[56] References Cited

U.S. PATENT DOCUMENTS

| | | | |
|---|---|---|---|
| 3,901,737 | 8/1975 | Dash | 148/1.5 |
| 4,415,371 | 11/1983 | Soclof | 148/1.5 |
| 4,419,150 | 12/1983 | Soclof | 148/187 |
| 4,466,178 | 8/1984 | Soclof | 29/576 |
| 4,523,369 | 6/1985 | Nagukubo | 29/576 |
| 4,533,430 | 8/1985 | Bower | 156/643 |
| 4,534,824 | 8/1985 | Chen | 156/628 |
| 4,653,177 | 3/1987 | Lebowitz et al. | 29/578 |
| 4,756,793 | 7/1988 | Peek | 156/640 |
| 4,918,027 | 4/1990 | Fuse et al. | 437/35 |
| 5,047,359 | 9/1991 | Nagatomo | 437/35 |
| 5,506,168 | 4/1996 | Morita et al. | 437/67 |

FOREIGN PATENT DOCUMENTS

| | | | |
|---|---|---|---|
| 363156318 | 6/1988 | Japan | 438/169 |
| 403084924 | 4/1991 | Japan | 438/169 |
| 403289145 | 12/1991 | Japan | 438/169 |
| 404010640 | 1/1992 | Japan | 438/172 |
| 404152549 | 5/1992 | Japan | 438/169 |
| 405343515 | 12/1993 | Japan | 438/169 |
| 405343680 | 12/1993 | Japan | 438/169 |

OTHER PUBLICATIONS

Tonti et al., *Impact of Shallow Trench Isolation on Reliability of Buried–and Surface–Channel Sub–μm PFET*, IRPS, 1995, pp. 24–29.

*Primary Examiner*—Jey Tsai
*Assistant Examiner*—Long Pham
*Attorney, Agent, or Firm*—Myers Bigel Sibley & Sajovec, P.A.

[57] ABSTRACT

A trench is formed in a substrate, the trench defining an active region surface on the substrate, the trench having a trench sidewall. A trench insulation region is then formed in the trench. The substrate underlying the trench sidewall is doped with impurities, and after the first doping, the substrate underlying the active region surface is doped with impurities to form a well having an impurity concentration which increases towards the trench sidewall in a predetermined manner. To form the trench, an insulation layer preferably is formed on the substrate, a barrier layer is formed on the insulation layer, and the barrier layer and the insulation layer are patterned to form an insulation region on the substrate and a barrier region on the insulation region. The substrate is then etched using the barrier region and the insulation region as a mask to thereby form a trench in the substrate. Preferably, the first doping includes implanting ions into the substrate through the trench insulation region and the trench sidewall using the barrier region as a mask. The second doping preferably is preceded by removal of the barrier region, and includes implanting ions into the substrate through the active region surface. The first implantation preferably occurs at a predetermined angle of incidence oblique to the active region surface or, more preferably, over a predetermined range of angles of incidence. The first and second doping steps may include doping with impurities of the same conductivity type or with opposite conductivity types.

11 Claims, 4 Drawing Sheets

5,795,801

1

METHODS OF FABRICATING PROFILED DEVICE WELLS FOR IMPROVED DEVICE ISOLATION

FIELD OF THE INVENTION

The present invention relates to semiconductor device fabrication methods, in particular, to methods of fabricating active regions and associated isolation regions for semiconductor devices.

BACKGROUND OF THE INVENTION

As is well-known to those skilled in the art, the isolation of active regions on a semiconductor substrate may be achieved using local oxidation of silicon (LOCOS) techniques, wherein an isolation region is grown on a substrate between active regions by thermal oxidation. Although widely used, LOCOS techniques may suffer from problems associated with thermal treatment, including formation of so-called "bird's beaks," i.e., encroachment of oxidation into the active region adjacent an isolation region due to thermal treatment, and redistribution of impurities from active regions into adjacent isolation regions. Thus, LOCOS techniques may not be suitable for forming high-density integrated circuits.

In order to avoid the problems associated with LOCOS techniques, shallow trench isolation (STI) techniques have been developed. Conventional STI techniques typically involve etching the semiconductor substrate to form a trench, and then filling the trench with insulating material to form an isolation region. Because the isolation region typically is not formed by thermal treatment, some of the disadvantages associated with techniques such as LOCOS may be avoided. In addition, the dimensions of isolation region may be more closely controlled, allowing the formation of trenches having widths of 0.2 µm or less for high density devices such as dynamic access random access memories (DRAMs) having capacity of 1 gigabit and larger.

Unfortunately, however, conventional STI fabrication techniques may produce performance and reliability problems. FIG. 1 is a cross-sectional view illustrating a metal-oxide semiconductor field effect transistor (MOSFET) produced by conventional trench isolation, as described in W. Tonti et al, "*Impact of shallow trench isolation on reliability of buried- and surface-channel sub-µm PFET*", IRPS, 1995, pp.24–29. Conventional fabrication techniques may produce a transistor 1 including a gate electrode 9 which is recessed at corners 3 where an insulation region layer 5 and an active region 7 meet. When voltage is supplied to the gate electrode 9, the electric field strength at the corners 3 may be stronger than the field near central portions of the active region 7, such that an inversion layer is formed at the corners 3 first.

A typical NMOS transistor is formed in a p-type well, using impurities, typically boron, implanted into the active region 7 to form the well and control the threshold of the transistor 1. These impurities may migrate into the isolation region 5 during heat treatment of the substrate. Thus, the concentration of impurities near the corners 3 may be lower than that of central portions of the channel region 7. Accordingly, as illustrated in FIG. 2, the threshold voltage A near central portions of the active region may vary significantly from the threshold voltage B near the corners 3, producing a "hump" phenomenon in the voltage/current characteristic of the transistor 1 in a subthreshold region, which may lead to increased leakage current and degradation of the transistor's on-off characteristic. As the channel width of the device is decreased, the leakage current typically increases. PMOS devices fabricated in an n-type well formed by implantation of ions such as phosphorus and arsenic may suffer similar performance problems due to the accumulation of the phosphorus or arsenic ions on the trench sidewall.

Compensation for impurity migration may be provided by implanting additional impurities into the sidewall after formation of the isolation region 5, to increase the concentration of impurities of a given conductivity type in the active region 7 near the corners 3 where the active region 7 meets the isolation region 5. However, this method typically involves at least two photolithography processes and may cause increased leakage current or junction capacitance due to impurities implanted into the bottom of the trench during implantation into the trench sidewalls.

SUMMARY OF THE INVENTION

In light of the foregoing, it is an object of the present invention to provide methods of fabricating improved trench isolation regions.

It is another object of the present invention to provide methods of fabricating improved trench isolation regions in a substrate which produce desirable leakage current and turn-off characteristics.

This and other objects, features and advantages are provided according to the present invention by semiconductor fabrication techniques in which a trench is formed in a substrate, defining an active region surface on the substrate, a trench insulation region is formed in the trench, and impurities are doped into the sidewall of the trench before doping impurities into the substrate underlying the active region surface to form a well. The well thus formed has an impurity concentration which increases towards the trench sidewall, compensating for impurity migration near the trench sidewall. In addition, the ordered doping procedure allows the use of a single photolithography step, which can simplify fabrication.

In particular, according to the present invention, an isolated well is formed in a substrate by forming a trench in the substrate, the trench defining an active region surface on the substrate adjacent the trench, the trench having a trench sidewall. A trench insulation region is then formed in the trench. The substrate underlying the trench sidewall is doped with impurities, and after the first doping step, the substrate underlying the active region surface is doped with impurities to thereby form a well in the substrate underlying the active region surface and adjacent the trench sidewall, the well having an impurity concentration which increases towards the trench sidewall in a predetermined manner.

To form the trench, an insulation layer preferably is formed on the substrate, a barrier layer is formed on the insulation layer, and the barrier layer and the insulation layer are patterned to form an insulation region on the substrate and a barrier region on the insulation region. The substrate is then etched using the barrier region and the insulation region as a mask to thereby form a trench in the substrate, the trench defining an active region surface on the substrate adjacent the trench, the active region surface underlying the insulation region and the barrier region.

The trench insulation region preferably is formed by forming a second insulation layer on the substrate, covering the barrier region, and removing portions of the second insulation layer to expose the barrier region and leave a trench insulation region in the trench. Formation of the trench insulation region preferably includes planarizing the second insulation layer to expose the barrier region and leave a portion of the second insulation layer in the trench, and anisotropically etching the portion of the second insulation layer in the trench adjacent the barrier region to expose a sidewall portion of the barrier region and leave a trench insulation region in the trench, the trench insulation region extending above the trench sidewall. Thus, a gate electrode may be subsequently formed which does not overlap corners of the active region surface. The gate electrode may be formed by removing the insulation region overlying the active region surface to expose the active region surface, forming a second insulation region on the active region surface, and forming a semiconductor region on the second insulation region on the active region surface.

Preferably, the first doping step includes implanting ions into the substrate through the trench insulation region and the trench sidewall using the barrier region as a mask. The second doping step preferably is preceded by removal of the barrier region, and includes implanting ions into the substrate through the active region surface. The first implantation preferably includes implanting ions into the substrate at a predetermined angle of incidence oblique to the active region surface, more preferably, implanting ions into the substrate over a predetermined range of angles of incidence oblique to the active region surface. Uniform distribution of impurities may thereby be provided.

The first and second doping steps may include doping with impurities of the same conductivity type, for example, p-type impurities used to form a p-type well for an NMOS device. The first and second doping steps may include doping with impurities of opposite conductivity types, for example, using p-type impurities to dope adjacent the trench sidewall while doping with n-type impurities to form the n-well for a PMOS device. Thus, compensation for impurity migration may be provided for complementary devices.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION OF PREFERRED EMBODIMENTS

Figure 1:
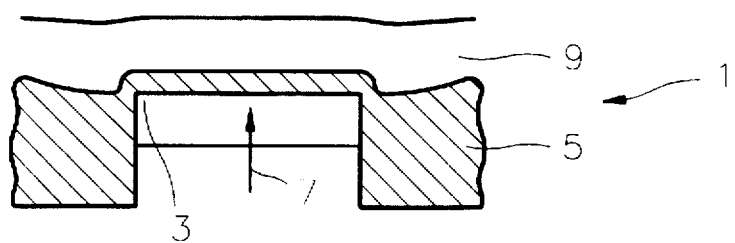
FIG. 1 is a cross-sectional view illustrating a MOSFET produced according to conventional fabrication techniques.
Figure 2:
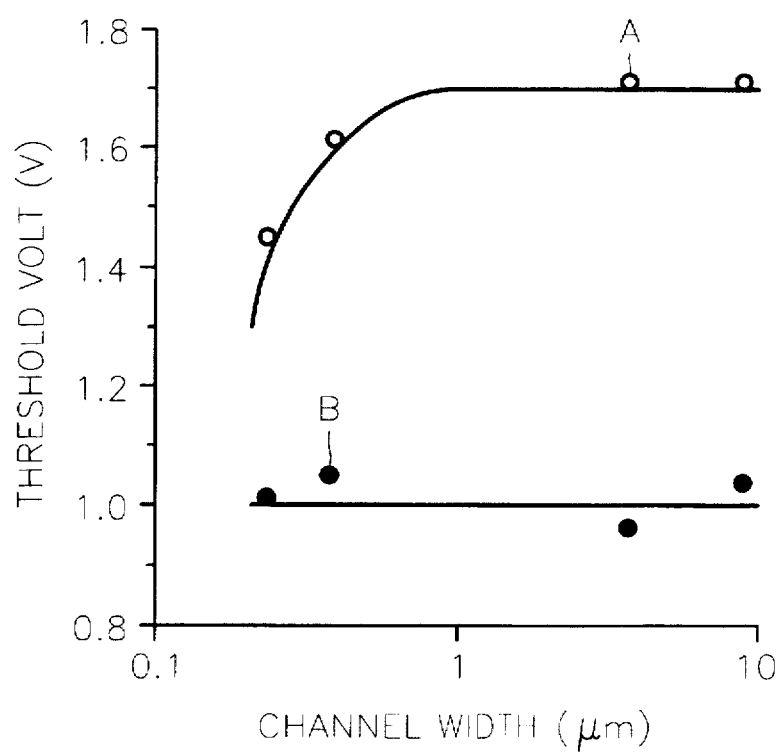
FIG. 2 illustrates threshold voltage characteristics of a MOSFET produced according to conventional fabrication techniques.

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and like numbers refer to like elements throughout. Moreover, the term "conductivity" refers to particular conductivity types such as p- or n-type. Each embodiment described and illustrated herein includes complementary embodiments.

Figure 3:
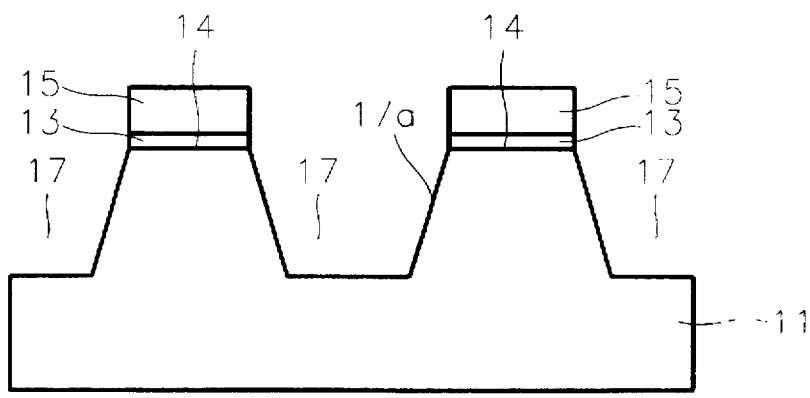
FIGS. 3 through 7 are cross-sectional views of intermediate fabrication products illustrating steps for fabricating an isolated well in a semiconductor substrate according to the present invention.

Referring to FIG. 3, an insulation layer, preferably silicon dioxide having a thickness of approximately 10–200 Åis formed on a substrate 11, preferably silicon. A barrier layer, preferably silicon nitride deposited to approximately 1,000–3,000 Åis then formed on the insulation layer. An insulating film such as a high-temperature oxide (HTO) may also be deposited in multiple layers on the barrier layer, to serve as a mask during subsequent etching steps.

An active region surface 14 is then defined on the substrate 11 by patterning the barrier layer and the insulation layer to form a barrier region 15 and an insulation region 13 overlying the active region surface 14, preferably using conventional photolithography. Portions of the substrate 11 adjacent the barrier region 15 and the insulation region 13 are then etched to form a trench 17, using the barrier region 15 and the insulation region 13 as an etching mask. An insulation layer may then be formed on the exposed trench 17, preferably a silicon dioxide layer having a thickness of several tens to hundreds of Angstroms grown on the trench 17 through thermal oxidation. The insulation layer can repair damage to the substrate 11 produced by the etching process and prevent further damage due to stress during subsequent processing. The thermal oxidation may also help round sharp corners of the trench sidewall 17a.

Figure 4:
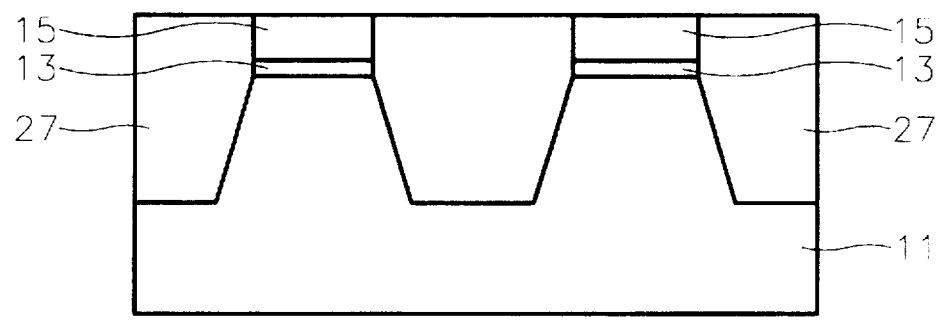

As illustrated in FIG. 4, the trench 17 is then filled by forming an insulation layer, preferably silicon dioxide having a thickness of thousands of Angstroms. The insulation layer is then planarized, preferably by chemical mechanical polishing or etching, until the barrier region 15 is exposed, thus leaving a trench insulation region 27 in the trench 17.

Figure 5:
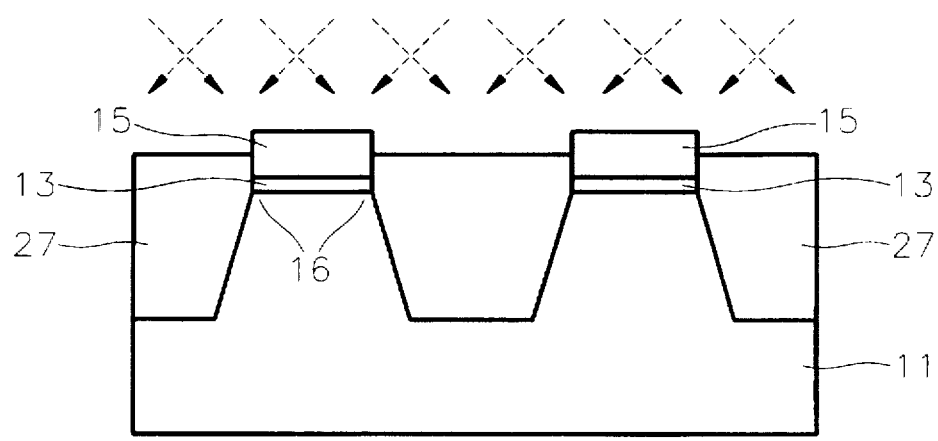

Referring to FIG. 5, a portion of the trench insulation region 27 in the trench 17 is then removed, preferably by anisotropic etching, to expose a portion of a sidewall of the barrier region 15. Preferably, the trench insulation region 27 is etched such that the trench insulation region 27 extends above the active region surface 14, so that when a gate electrode is subsequently formed on the insulation region 13, the gate electrode will not overlap the corner 16 at which the active region surface 14 meets the trench sidewall 17a.

Ions are then implanted into the substrate 11 through the trench insulation region 27 and the trench sidewall 17a, using the barrier region 15 as a mask. Preferably, the implantation occurs at a predetermined angle of incidence oblique to the active region surface 17, to allow a sufficient concentration of impurities to be formed in portions of the substrate 11 near the trench sidewall 17a. To more uniformly implant impurities into the corner 16, the impurities may be implanted over a predetermined range of angles of incidence, e.g., by rotating the substrate 11 or by rotating the source of ions through a predetermined range.

Figure 6:
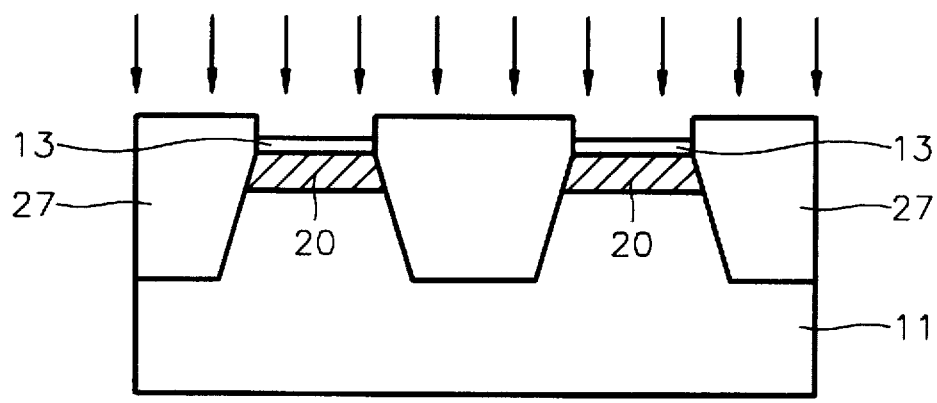
Figure 7:
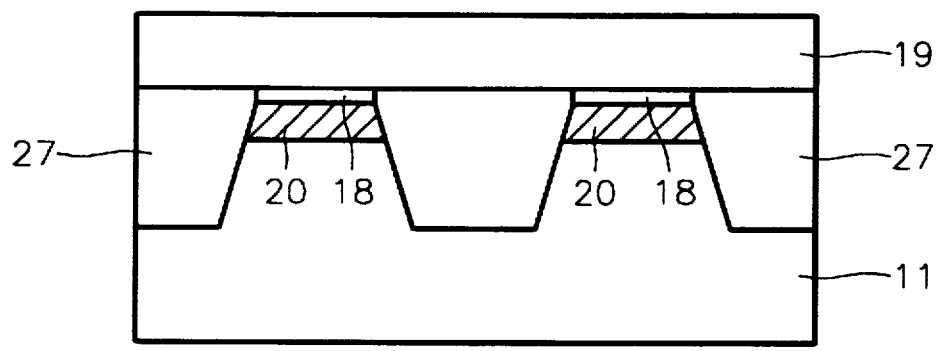

Referring to FIG. 6, after removing the barrier region 15, ions may then be implanted into the substrate 11 through the insulation region 13 and the active region surface 14 to form a well 20. Alternatively, the insulation region 13 may be removed along with the barrier region 15 to expose the active region surface 14, and a second insulation region formed on the active region surface 14 before implantation to form the well 20. As illustrated in FIG. 7, the insulation region 13 overlying the active region surface 14 may then be removed, and a gate insulation region 18, preferably silicon dioxide having a thickness of several tens of Angstroms, formed on the active region surface 14. A semiconductor layer 19, preferably polysilicon, may then be formed on the gate insulation region 18, for use in subsequently forming a gate electrode for a transistor using techniques well known to those skilled in the art.

Those skilled in the art will appreciate that other steps may be included with those described above. For instance, to selectively dope portions of substrate underneath the trench sidewall 17a, the insulation layer from which the trench isolation regions are formed may be etched to a predetermined depth and a photomask formed thereon for selective ion-implantation through the trench sidewall 17a. The photomask preferably allows removal of the barrier region 15 and a second ion implantation to form the well before removal of the photomask, thus allowing the use of a single photolithographic operation to form the well. The trench sidewall implantation and well implantation steps may also be performed using a dummy pattern layer, for example, a polysilicon layer, formed after formation of the insulation regions 27.

In order to form a p-type well in a substrate, impurities having the same conductivity type as the well, for example, boron or $BF_2$, preferably are implanted into the trench sidewall to compensate for reduced p-type impurity concentration due migration of boron from portions of the substrate near the trench sidewall. To form an n-type well, boron or $BF_2$, having p-type conductivity different from that of the n-type well preferably is implanted into the trench sidewall to compensate for increased concentration of n-type impurities due to accumulation near the trench sidewall of the n-type impurities used for the well implant, e.g., phosphorus and arsenic ions. Thus a well having an impurity concentration which increases in a predetermined manner towards the trench sidewall may be formed, compensating for the negative effects arising from migration of impurities.

Figure 8:
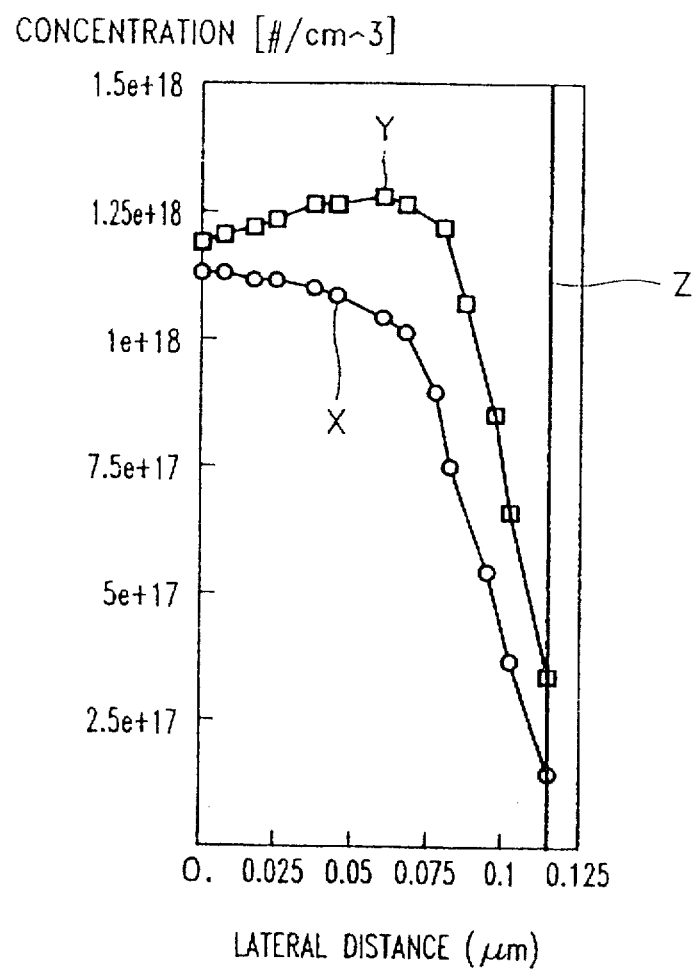
FIG. 8 illustrates impurity concentration in an isolated well produced according to the present invention.

Referring to FIG. 8, the line Z represents a boundary between an active region surface and a trench sidewall. The curve X represents impurity concentration of a well formed beneath the active region surface according to conventional techniques. The curve Y represents impurity concentration in a well formed according to the present invention. As is illustrated, the impurity concentration of the well increases in a predetermined manner towards the trench sidewall. The increased concentration near the trench sidewall can reduce electric field penetration into the well and suppress depletion region expansion near the junction of the trench sidewall and the active region surface. The associated "hump" in the voltage/current characteristic may also be minimized and leakage current reduced.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of forming an isolated well in a substrate, the method comprising the steps of:
    forming a trench in the substrate, the trench defining an active region surface on the substrate adjacent the trench, the trench having a trench sidewall adjacent the active region surface;
    forming a trench insulation region in the trench;
    first doping the substrate underlying the trench sidewall with impurities; and
    after said first doping step, second doping the substrate underlying the active region surface with impurities to thereby form a well in the substrate underlying the active region surface and adjacent the trench sidewall, the well having an impurity concentration which increases towards the trench sidewall.

2. A method according to claim 1 wherein said step of forming a trench comprises the steps of:
    forming an insulation layer on the substrate;
    forming a barrier layer on the insulation layer;
    patterning the barrier layer and the insulation layer to form an insulation region on the substrate and a barrier region on the insulation region; and
    etching the substrate using the barrier region and the insulation region as a mask to thereby form a trench in the substrate, the trench defining an active region surface on the substrate, the active region surface underlying the insulation region and the barrier region.

3. A method according to claim 2 wherein said step of forming a trench insulation region comprises the steps of:
    forming a second insulation layer on the substrate, covering the barrier region; and
    removing portions of the second insulation layer to expose the barrier region and leave a trench insulation region in the trench.

4. A method according to claim 3 wherein said step of removing comprises the steps of:
    planarizing the second insulation layer to expose the barrier region and leave a portion of the second insulation layer in the trench; and
    anisotropically etching the portion of the second insulation layer in the trench adjacent the barrier region to expose a sidewall portion of the barrier region and leave a trench insulation region in the trench, the trench insulation region extending above the trench sidewall.

5. A method according to claim 4, further comprising the steps of:
    removing the insulation region overlying the active region surface to thereby expose the active region surface;
    forming a second insulation region on the active region surface; and
    forming a semiconductor region on the second insulation region on the active region surface.

6. A method according to claim 3:
    wherein said first doping step comprises the step of implanting ions into the substrate through the trench insulation region and the trench sidewall using the barrier region as a mask;
    wherein said second doping step is preceded by the step of removing the barrier region; and
    wherein said second doping step comprises the step of implanting ions into the substrate through the active region surface.

7. A method according to claim 6 wherein said first step of implanting ions comprises the step of implanting ions into the substrate at angle of incidence oblique to the active region surface.

8. A method according to claim 6 wherein said first step of implanting ions comprises the step of implanting ions into the substrate over range of angles of incidence oblique to the active region surface.

9. A method according to claim 1:
    wherein said first doping step comprises the step of doping the substrate underlying the trench sidewall with impurities of first conductivity type; and
    wherein said second doping step comprises the step of doping the substrate underlying the active region surface with impurities of second conductivity type.

10. A method according to claim 1:

wherein said first doping step comprises the step of doping the substrate underlying the trench sidewall with impurities of first conductivity type; and wherein said second doping step comprises the step of doping the substrate underlying the active region surface with impurities of first conductivity type.

11. A method of forming an isolated well in a substrate, the method comprising the steps of:

forming an insulation layer on the substrate;

forming a barrier layer on the insulation layer;

patterning the barrier layer and the insulation layer to form an insulation region on the substrate and a barrier region on the insulation region;

etching the substrate using the barrier region and the insulation region as a mask to thereby form a trench in the substrate, the trench defining an active region surface on the substrate, the active region surface underlying the insulation region and the barrier region;

p1 forming a second insulation layer on the substrate, covering the barrier region;

planarizing the second insulation layer to expose the barrier region and leave a portion of the second insulation layer in the trench;

anisotropically etching the portion of the second insulation layer in the trench adjacent the barrier region to expose a sidewall portion of the barrier region and leave a trench insulation region in the trench, the trench insulation region extending above the trench sidewall;

implanting ions into the substrate through the trench insulation region and the trench sidewall using the barrier region as a mask;

removing the barrier region; and implanting ions into the substrate through the active region surface.

\* \* \* \* \*

UNITED STATES PATENT AND TRADEMARK OFFICE
CERTIFICATE OF CORRECTION

PATENT NO. : 5,795,801
DATED : August 18, 1998
INVENTOR(S) : Kang-yoon Lee

It is certified that error appears in the above-identified patent and that said Letters Patent is hereby corrected as shown below:

Column 6, Line 55   Add -- an -- after "at".
Column 6, Line 59   Add -- a -- after "over".
Column 8, Line 1    Delete "p1"

Signed and Sealed this

First Day of June, 1999

Attest:

Q. TODD DICKINSON

*Attesting Officer*          *Acting Commissioner of Patents and Trademarks*